United States Patent [19]

Iranmanesh

[11] Patent Number: 4,829,025

[45] Date of Patent: May 9, 1989

[54] PROCESS FOR PATTERNING FILMS IN MANUFACTURE OF INTEGRATED CIRCUIT STRUCTURES

[75] Inventor: Ali Iranmanesh, San Antonio, Tex.

[73] Assignee: Advanced Micro Devices, Inc., Sunnyvale, Calif.

[21] Appl. No.: 104,197

[22] Filed: Oct. 2, 1987

[51] Int. Cl.$^4$ .......................................... H01L 21/265
[52] U.S. Cl. ..................................... 437/228; 437/31; 437/225; 437/241; 437/238; 156/653; 156/657; 156/659.1; 148/DIG. 51
[58] Field of Search ............... 437/228, 225, 229, 231, 437/233, 235, 236, 237, 238, 240, 241; 148/DIG. 51; 156/643, 653, 657, 659.1

[56] References Cited

U.S. PATENT DOCUMENTS

| | | | |
|---|---|---|---|
| 4,243,435 | 1/1981 | Barile | 437/175 |
| 4,667,395 | 5/1987 | Ahlgren | 437/228 |
| 4,675,984 | 6/1987 | Hsu | 156/653 |
| 4,693,782 | 9/1987 | Kikuchi et al. | 357/34 |
| 4,735,916 | 4/1988 | Homma | 437/193 |
| 4,780,427 | 10/1988 | Sakai | 437/197 |

Primary Examiner—Brian E. Hearn
Assistant Examiner—Kevin McAndrews
Attorney, Agent, or Firm—John P. Taylor

[57] ABSTRACT

An improved process is described for patterning films or layers, for example, in the manufacture of integrated circuit structures including bipolar and MOS devices on a silicon substrate, without damaging areas of the underlying substrate material, e.g., those portions of the substrate wherein active elements of an integrated circuit components will be formed. The process comprises patterning films or layers of dissimilar materials which respond differently to etchants to form a portion of masking materials over a selected area of an underlying substrate material and subsequently removing these masking materials using wet etching, at those steps in the process when damage to the underlying substrate material by dry etching may occur, to avoid damage to the underlying material by dry etching.

14 Claims, 3 Drawing Sheets

PROCESS FOR PATTERNING FILMS IN MANUFACTURE OF INTEGRATED CIRCUIT STRUCTURES

BACKGROUND OF THE INVENTION

This invention relates to a improved process for patterning films used in the manufacture of integrated circuit structures. More particularly, this invention relates to an improved process for patterning films which may be used in the manufacture of emitter and gate electrodes respectively for bipolar and MOS integrated circuit structures.

2. Description of the Related Art

As integrated circuit structures become more complex and the density of the circuitry on chips increases, attention has been directed toward increasing the speed of individual devices used in the structure.

This, in turn, has lead to the development of processes to provide more precise alignment of the elements comprising the device, including self-alignment techniques to achieve, among other things, better control of the capacitance between elements of a device in view of the negative impact on speed which high interelectrode capacitance will produce.

Ho et al U.S. Pat. No. 4,381,953 describe a method for making a self-aligned bipolar transistor on a silicon substrate having a buried collector layer and an epitaxial layer thereon of a first conductivity type with an oxide isolation region formed between a collector sinker to the buried collector layer and the base/emitter portions of the transistor.

The Ho et al process includes the steps of depositing a doped polysilicon layer on the exposed epitaxial surface with the dopant being of opposite conductivity to the conductivity of the epitaxial layer; depositing a layer of silicon dioxide on the doped polysilicon layer; depositing a layer of photoresist on the oxide and masking off an intended intrinsic base region; using the resist as a mask, reactive ion etching away the oxide and polysilicon over the intended intrinsic base region; ion implanting the exposed intrinsic base region with ions of the first conductivity type; depositing an oxide layer on the exposed surface; reactive ion etching an emitter opening through the oxide layer and on the epitaxial surface above the implanted intrinsic base region; ion implanting the emitter region with ions of the opposite conductivity type; and then using a common heat cycle to anneal the ion implantations and drive in the emitter, intrinsic base, extrinsic base, and collector sinker.

Kayanuma et al U.S. Pat. No. 4,584,055 discloses a modified process for opening the window to the substrate for the base implant using a combination of reactive ion etching and selective wet etching to remove the overlying polysilicon using the Miller indices of the single silicon substrate to provide an etch stop for the wet etching.

While the above described processes can result in the formation of a satisfactory product, the reactive ion etching steps carried out, for example, over the emitter/base region of the substrate (or similarly, over the channel region of an MOS device, or the region of a substrate where a Schottky diode junction or a resistor will be formed), may result in damage to the substrate, including the epitaxial layer resulting in increased leakage and non-repeatable characteristics of devices fabricated in this manner. It would be desirable to provide a process for patterning films or layers on integrated circuit structures, without the use of reactive ion type dry etching techniques at those steps in the process when damage to the underlying material may occur.

SUMMARY OF THE INVENTION

It is therefore an object of this invention to provide an improved process for patterning films in integrated circuit structures without using dry etching techniques at those steps in the process when damage to the underlying material by dry etching may occur.

It is another object of this invention to provide an improved process for patterning films in integrated circuit structures, without using dry etching techniques at those steps in the process when damage to the underlying material by dry etching may occur, which may be used in the manufacture of emitter and gate electrodes, respectively, for bipolar and MOS integrated circuit structures.

It is a further object of this invention to provide an improved process for constructing integrated circuit structures wherein damage to the underlying substrate by dry etching is minimized.

These and other objects of the invention will be apparent from the following description and accompanying drawings.

DETAILED DESCRIPTION OF THE INVENTION

Turning now to FIGS. 1-6, the process of the invention is sequentially illustrated for the patterning of films without the use of dry etching techniques, at those steps in the process when damage to the underlying material may occur, in a specific embodiment wherein the possibility of damage to an underlying semiconductor substrate is minimized in the region of the substrate where active portions of devices such as bipolar and MOS transistors may be subsequently formed.

Figure 1:
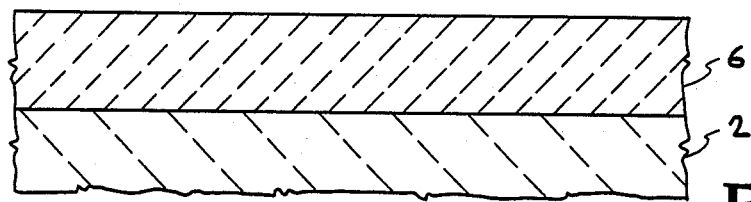
FIGS. 1-6 are fragmentary side-section views showing sequentially the steps for patterning of films without dry etching, at those steps in the process when damage to the underlying material by dry etching may occur, in the construction of an integrated circuit structure in accordance with one embodiment of the process of the invention.

A substrate 2 is shown in FIG. 1, which may conventionally comprise a silicon substrate in an integrated circuit structure, or, alternatively may comprises another type of semiconductor or even an insulation layer. On substrate layer 2 is formed first film layer 6 of a dissimilar material to that of substrate 2, i.e., a material which will be responsive to different chemical etchants than the material comprising substrate 2. First film layer 6, for example, may comprises an oxide or nitride layer when substrate 2 comprises silicon.

Figure 2:
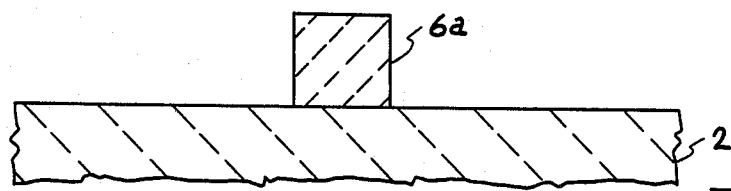

First film layer 6 is patterned with a conventional photoresist layer (not shown) and then selectively etched with an etchant which will not attack substrate 2 to form the structure shown in FIG. 2 with only pedestal portion 6a remaining of first film layer 6. For example, when first film layer comprises an oxide layer and substrate 2 is silicon, layer 6 may be chemically etched with an ammonium fluoride buffered etchant. While the use of dry etching is to be avoided, in accordance with the invention, at those stages of the process where such dry etching would damage the substrate where the active portions of a device will be formed, e.g., the emitter/intrinsic base of a bipolar device, pedestal 6a is formed over the active region of substrate 2 and therefore a dry or anisotropic etchant, such as a plasma etch, may be used to selectively etch layer 6 to form pedestal 6a. In fact, due to the straight sidewalls formed by an anisotropic etch, at this point in the process an anisotropic etch is actually preferred.

A second film layer 10, which comprises the layer which is to be ultimately patterned in the resulting structure, must comprise a material with a different response to chemical etchants than first film layer 6, is then applied over substrate layer 2 and portion 6a of layer 6. In the illustrated embodiment shown in FIG. 3, second layer 10 may comprise a polysilicon layer. Yet a third layer 14 is then applied over second layer 10. Third layer 14 preferably comprises a material which will also have yet a different response to chemical etchants than either first layer 6 or second layer 10 to permit selective chemical etching of the three layers. In the illustrated embodiment of FIG. 3, third layer 14 may comprise a silicon nitride layer.

Figure 3:
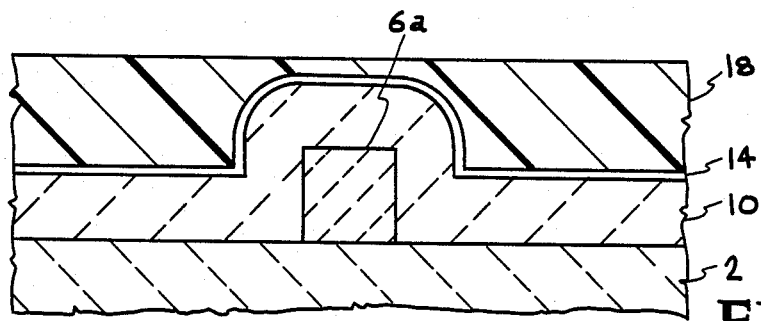
Figure 4:
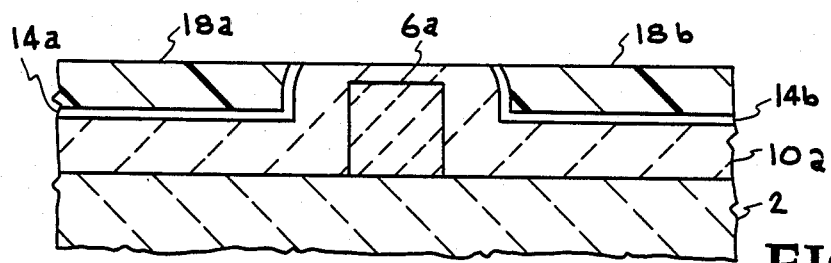

Still referring to FIG. 3, a planarizing layer 18 of a material having a sufficiently low viscosity to provide a planar surface when spun onto the structure, e.g., a layer of photoresist, is then applied over the structure and the structure is then either etched or mechanically polished down to the level shown in FIG. 4. This results in the removal of, in the region above pedestal portion 6a, all of planarizing layer 18, all of layer 14, and some of layer 10, leaving only a portion 10a, of layer 10, remaining over portion 6a. It also leaves portions 18a and 18b of photoresist layer 18; portions 14a and 14b of third layer 14; and the remainder of portion 10a of second layer 10 remaining over substrate 2 adjacent pedestal portion 6a.

It should be noted that a dry etch, such as a reactive ion etch, may be used at this stage of the process since the underlying layer, e.g., substrate layer 2, where covered by pedestal 6a (the portion of the structure which the process of the present invention seeks to protect from damage by dry etching) is sufficiently masked by layers 10, 14, and 18, as well as pedestal portion 6a, so that the ion beam cannot penetrate therethrough to damage substrate 2, particularly in the region immediately below portion 6a. Wet etching may also be used at this step. However, since portions of several layers are to be removed, this will necessitate the use of several etchants which will make control of such wet etching more difficult.

The remaining portions 18a and 18b of photoresist layer 18 may now be removed using conventional wet chemical processing such as, for example, acetone for positive photoresist, or using an oxygen plasma.

Figure 5:
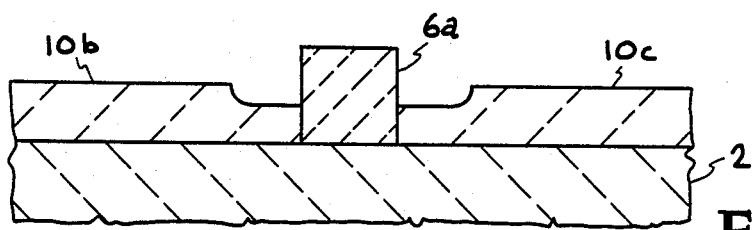

The area of second layer 10a not masked by third layer portions 14a and 14b is now etched. This etching step, which preferably is a wet etching step but which may be done by dry etching, is carried out until removal of a sufficient amount of portion 10a has occurred to at least expose first layer portion 6a as shown in FIG. 5, leaving remaining portions 10b and 10c of layer 10. When second layer 10 comprises polysilicon, portion 6a comprises silicon oxide, and third layer 14 comprises silicon nitride, a KOH etch will selectively etch second polysilicon layer 10a without significantly attacking the other layers.

Following the etching of layer 10a, remaining portions 14a and 14b of third layer 14 may be selectively removed by another selective wet etch step, using a chemical etchant which will not significantly attack the other layers. The etchant used in this step may, for example, comprise phosphoric acid which, in turn, will not significantly attack the other layers when third layer 14 comprises silicon nitride, second layer 10 comprises polysilicon, and portion 6a comprises silicon oxide, leaving the structure shown in FIG. 5.

Figure 6:
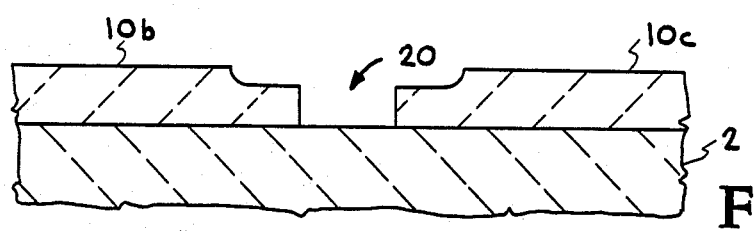

Finally, portion 6a may be selectively removed to provide the structure shown in FIG. 6. This step may be accomplished by again using a selective wet chemical etchant which will only etch portion 6a, without substantially attacking remaining portions 10b and 10c of layer 10 or the underlying material, in this case, substrate 2. For example, such a selective etchant may comprise a buffered ammonium fluoride etch when portion 6a comprises silicon oxide and portions 10b and 10c of layer 10 comprise polysilicon. It should be noted that this step could possibly be carried out using a partial dry etch which is stopped prior to reaching substrate 2 followed by completion of the removal of pedestal portion 6a with a wet etch.

The exposed region of substrate 2 generally shown at opening 20 may now be doped, for example, using remaining portions 10b and 10c of layer 10 as masks, to form an active region in substrate 2 which will not be deleteriously effected by any previous dry etching damage to substrate 2 in view of the selective wet etching steps employed in the process, in accordance with the invention, at those steps in the process when damage to the underlying material by dry etching may occur. The resulting structure shown in FIG. 6 provides excellent patterning of layer 10 to form opening 20 with straight sidewalls and excellent size control without incurring damage to substrate 2 in the region under opening 20.

Referring now to the process shown sequentially in FIGS. 7-14, specific utilization of the process of the invention in forming an emitter region and contact for a bipolar transistor or a gate contact for an MOS device will be illustrated.

Figure 7:
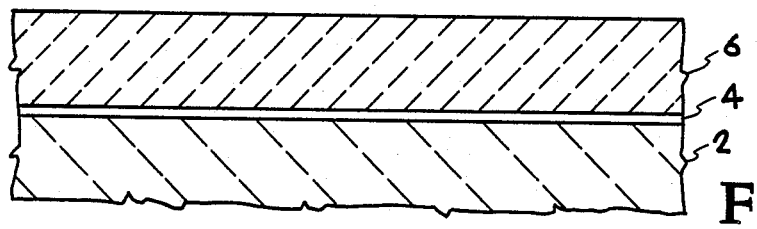
FIGS. 7-14 are fragmentary side-section views of another embodiment of the invention showing sequentially the steps for patterning films without dry etching, at those steps in the process when damage to the underlying material by dry etching may occur, as in FIGS. 1-6, but modified in particular to form an emitter region or a gate electrode for an integrated circuit structure.

Turning now to FIG. 7, a substrate layer 2 is again depicted. However, in this instance substrate 2 is provided with a barrier layer 4 beneath first film layer 6. Barrier layer 4 is formed using a material dissimilar to substrate 2 and first layer 6 to permit selective chemical etching in accordance with the invention. Barrier layer 4 may comprise a silicon nitride layer when substrate 2 comprises silicon and first layer 6 comprises silicon oxide.

Figure 8:
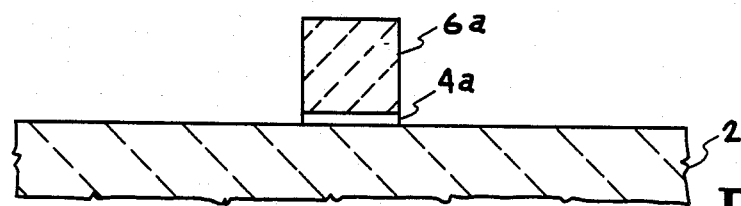

First layer 6 is masked at etched, as described in the previous embodiment, to form portion 6a as shown in FIG. 8. However, the presence of barrier layer 4 can be used to permit more variety in the form of the chemical etchant used since the etchant need not be selective between substrate 2 and first layer 6 since barrier layer 4 may be used as an etch block to protect substrate 2 from the etchant used on layer 6.

For example, if substrate 2 is silicon and first layer 6 is silicon oxide, an HF etchant may be used to etch layer 6, if barrier layer 4 comprises silicon nitride. While such an etchant would normally also be an etchant for silicon substrate 2, the presence of a silicon nitride barrier layer 4 over a silicon substrate 2 will protect substrate 2 thereunder from the etchant used on layer 6. In such a case, the remaining portions of the barrier layer would then also be subsequently removed, e.g., by a phosphoric acid etch when barrier layer 4 is silicon nitride, resulting in the structure shown in FIG. 8 wherein barrier layer portion 4a remains under first layer portion 6a, i.e., both barrier layer 4 and first film layer 6 are patterned.

Figure 9:
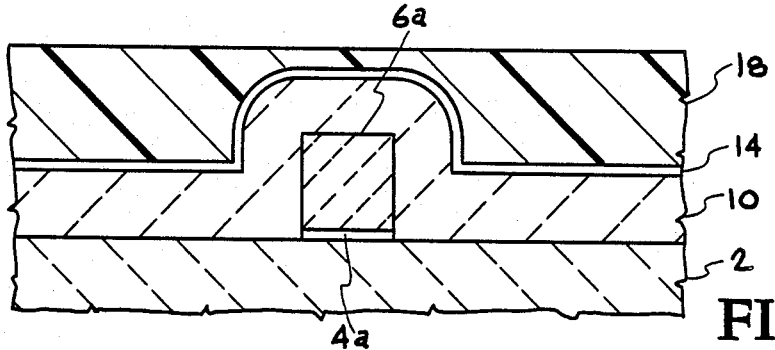
Figure 10:
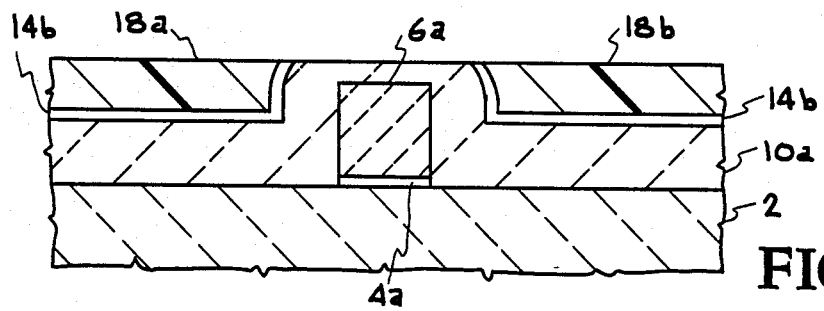

After formation of portion 6a, as shown in FIG. 9, second layer 10 and third layer 16 are applied, together with photoresist layer 18, as in the previous embodiment, and then planarized to form the structure shown in FIG. 10.

Figure 11:
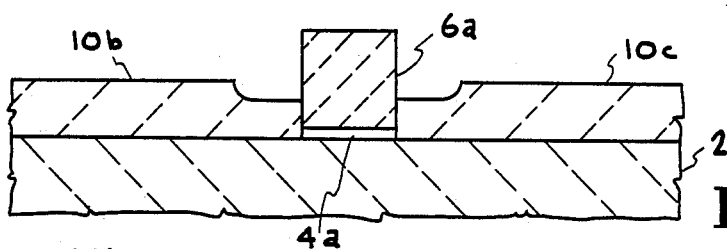

The exposed portion of second layer 10a is then selectively wet etched, as previously described, followed by removal of the remaining portions of the photoresist layer and third layer portions 18a and 18b to provide the structure shown in FIG. 11.

Figure 12:
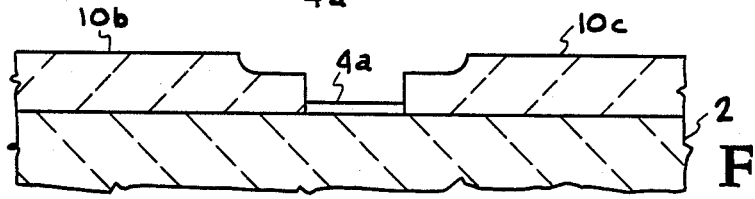

Portion 6a of first layer 6 is then selectively removed with a wet chemical etch which will not attack portions 10b and 10c of second layer 10 nor barrier layer portion 4a under portion 6a. When barrier layer 4 comprises silicon nitride, second layer 10 comprises polysilicon, and first layer 6 comprises silicon oxide, oxide portion 6a may be selectively removed by a wet etchant such as buffered ammonium fluoride etchant as shown in FIG. 12.

Figure 13:
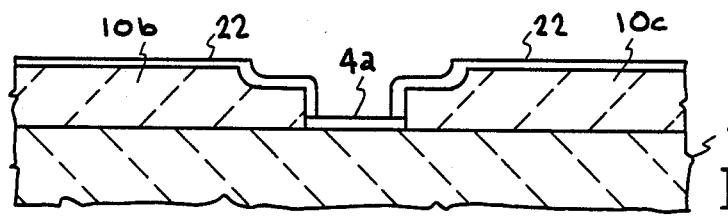

The structure may then be subject to an oxidation step which will selectively grow an oxide layer 22 over polysilicon portions 10b and 10c as shown in FIG. 13. Barrier layer portion 4a may now be selectively removed in preparation for the formation of either an emitter or gate electrode structure. When barrier layer portion 4a comprises silicon nitride, a phosphoric acid etchant may be used to selectively remove the silicon nitride.

Figure 14:
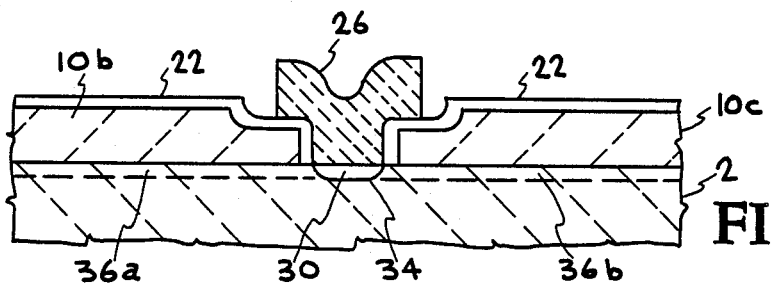

If an MOS type structure is to be formed, a gate oxide layer 30 may now be grown over the portion of silicon substrate 2 exposed by removal of the silicon nitride barrier portion 4a. A polysilicon layer may, then be applied and patterned to form gate electrode 26 as shown in FIG. 14 with region 34 depicting the channel formed in substrate 2. In such an instance, polysilicon layer 10 may be doped to the opposite conductivity type as substrate silicon 2, in which case source and drain regions 36a and 36b, shown in dotted lines in FIG. 14 may be diffused into substrate 2 with polysilicon portions 10b and 10c then serving as the source and drain contacts.

Alternatively, when a bipolar device is to be constructed, upon removal of silicon nitride barrier portion 4a, a silicon layer, doped to an opposite conductivity type to that of silicon substrate 2, is directly applied to the structure and patterned to form an emitter contact 26. Region 34 in FIG. 14 then represents an emitter region diffused into silicon substrate 2 with polysilicon portions 10b and 10c then forming contacts to the base region comprising substrate 2.

As in the previous embodiment, the patterning of the various films or layers is carried out, to form various types of devices without the use of dry etching techniques at those steps in the process when damage to the underlying material by dry etching may occur.

A more detailed description as to how a bipolar transistor and/or an MOS transistor can be constructed from the structure just described may be found in my copending application A552 entitled AN IMPROVED METHOD FOR MAKING BIPOLAR AND CMOS INTEGRATED CIRCUIT STRUCTURES, filed on even date with this application and assigned to the assignee of this application.

In FIGS. 15–21, yet another embodiment or variation of the process is shown wherein self-aligned extrinsic base regions may be formed using the process of the invention wherein selective chemical etching, and not dry etching, is again used, in accordance with the invention, at those steps in the process when damage to the underlying material by dry etching may occur, to thereby pattern a series of films or layers of an integrated circuit structure without damaging the underlying substrate.

In this embodiment, as in the embodiment just described, a barrier layer 4 is first formed over substrate 2 followed by formation of a first layer 6 which is then patterned to form portion 6a. These steps are illustrated in FIGS. 7 and 8 since they are identical to the initial steps described in the previously embodiment.

Figure 15:
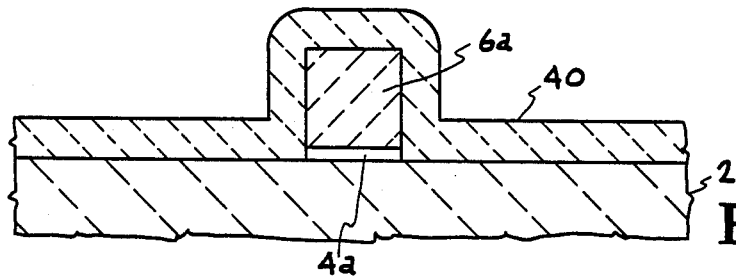
FIGS. 15-21 are fragmentary side-section views of yet another embodiment of the invention showing sequentially the steps for patterning films, without dry etching, at those steps in the process when damage to the underlying material by dry etching may occur, as in FIGS. 1-6, but modified to form an integrated circuit structure with a self-aligned extrinsic base region.
Figure 16:
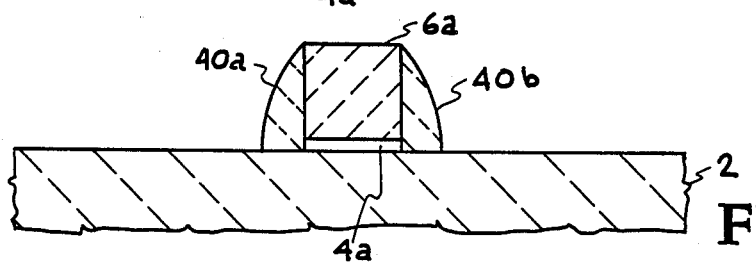

Turning now to FIG. 15, a layer 40 is applied over the structure, consisting of a material which differs from substrate 2 and first layer portion 6a. When substrate 2 comprises silicon and portion 6a comprises silicon oxide, layer 40 advantageously comprises silicon nitride. Layer 40 is then anisotropically etched to form spacer members 40a and 40b, respectively, on the sides of portion 6a, as shown in FIG. 16, which will then serve as masks over the portions of substrate 2 where the extrinsic base regions will be formed and contacts made thereto.

It should be noted that an anisotropic etch, such as a reactive ion etch (RIE), may be made at this time without damage to the substrate in the area where the active device will be formed due to the shielding of substrate 2 provided by portion 6a.

Figure 17:
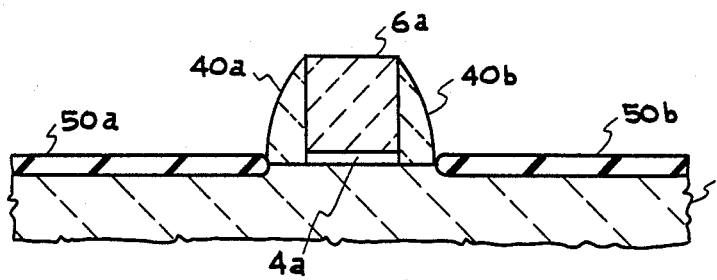

After formation of spacer members 40a and 40b, insulation portions 50a and 50b are formed over the remaining exposed area of substrate 2. Insulation portions 50a and 50b may conveniently comprise silicon oxide deposited or grown on the exposed portion of substrate 2 as shown in FIG. 17.

Figure 18:
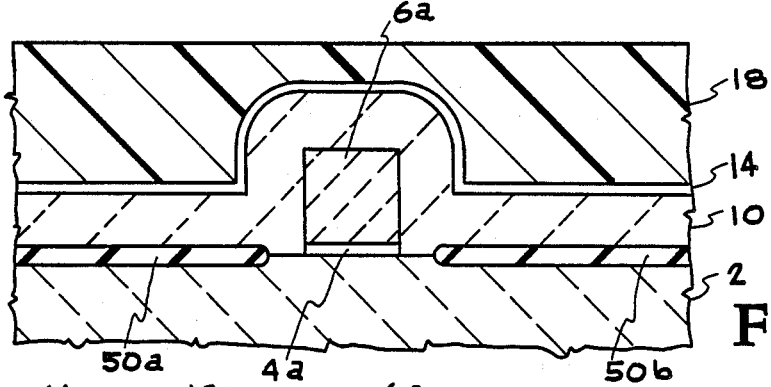
Figure 19:
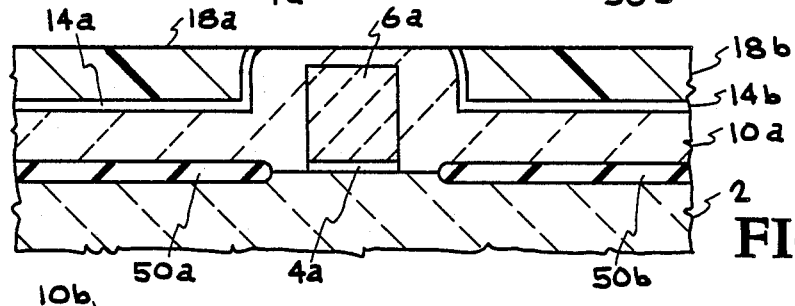
Figure 20:
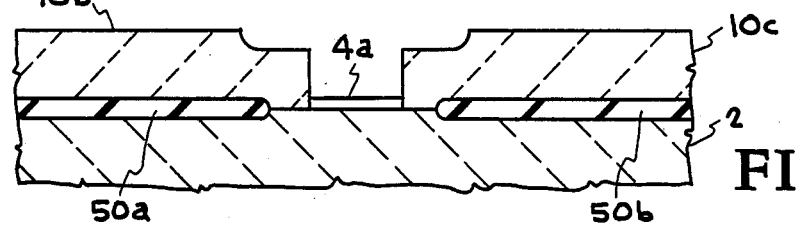

Spacers 40a and 40b are then removed from the structure, e.g. by use of a phosphoric etch when layer 40 is silicon nitride. The structure is then processed similarly to that previously described with respect to FIGS. 9–12 in the previous embodiment. That is, a second layer 10, which may comprise polysilicon; a third layer 14, which may comprise silicon nitride; and a photoresist layer 18 are sequentially applied over the structure as shown in FIG. 18. The structure is then planarized by mechanical polishing or anisotropic etching to for the structure shown in FIG. 19.

Layer 10a is then selectively etched with a chemical etch as previously described leaving portions 10b and 10c followed by removal of photoresist portions 18a and 18b and third layer portions 14a and 14b. Finally portion 6a is also removed resulting in the structure shown in FIG. 20 wherein only barrier portion 4a remains over the portion of the substrate where the active portion of the device will be formed.

The second layer portions 10b and 10c, which usually will comprise polysilicon or some other suitable conductive material, are covered with insulation material 22 which conveniently may comprise an oxide layer grown over portions 10b and 10c when second layer 10 comprises polysilicon. Barrier layer portion 4a is then removed, using a chemical (wet) etch, such as phosphoric acid when barrier layer 4 comprises silicon nitride, to avoid damage to the underlying substrate.

Figure 21:
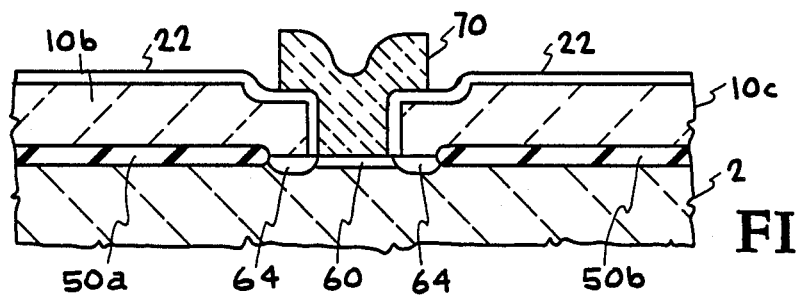

An intrinsic base may then be formed in the exposed substrate as shown at 60 in FIG. 21 using conventional diffusion or implantation procedures. During subsequent annealing, extrinsic base portions 64 may also be formed in substrate 2 by diffusion from polysilicon portions 10b and 10c which may be appropriately doped to permit such formation and which will then form base contacts through extrinsic base regions 64 to intrinsic base region 60. Finally an emitter 70 may be formed by applying a further layer of polysilicon which is then masked and patterned to form emitter 70.

Thus the invention provides an improved method of patterning films or layers in the formation of integrated circuit structures while mitigating damage to the substrate by avoiding the use of dry etching techniques in the active areas where elements such as the emitter of a bipolar transistor or the channel of an MOS device which may be subsequently formed in the substrate.

What is claimed is:

I claim:

1. A process for patterning a plurality of layers over an underlying silicon substrate without employing dry etching techniques at those steps in the process when damage to the underlying silicon substrate by dry etching may occur which comprises:
    (a) applying over said underlying silicon substrate a silicon nitride barrier layer capable of being removed by an etchant which will not remove a substantial amount of said underlying silicon substrate;
    (b) applying over said barrier layer a silicon oxide first film layer capable of being removed by an etchant which will not remove a substantial amount of said silicon nitride barrier layer;
    (c) patterning said silicon oxide first film layer and said silicon nitride barrier layer thereunder to provide one or more portions remaining over said underlying substrate material by masking said silicon oxide first film layer, etching exposed portions of said silicon oxide layer, and the etching the exposed portions of said silicon nitride barrier layer thereunder;
    (d) forming a silicon nitride spacer layer over said patterned silicon oxide first film layer;
    (e) anisotropically etching said silicon nitride spacer layer over said patterned first film layer to form spacer members on the sides of said patterned portions of said silicon oxide first film layer which will serve to mask portions of said silicon substrate thereunder;
    (f) forming insulation members over the remainder of said substrate;
    (g) removing said silicon nitride spacer members;
    (h) applying over said underlying silicon substrate and said one or more remaining portions of said silicon oxide first film layer a polysilicon second film layer capable of being removed by an etchant which will not remove a substantial amount of said silicon oxide first film layer;
    (i) applying over said polysilicon second film layer a silicon nitride third film layer capable of being removed by an etchant which will not remove a substantial amount of either said silicon oxide first film layer or said polysilicon second film layer;
    (j) applying a layer of photoresist material over said silicon nitride third film layer;
    (k) planarizing said structure to remove all of said photoresist layer and said silicon nitride third film layer in the region over said one or more remaining portions of said silicon oxide first film layer, thereby exposing said second polysilicon film layer;
    (l) etching exposed portions of said polysilicon second film layer to selectively remove portions of said polysilicon second layer without etching the exposed portions of said silicon nitride barrier layer or said portions of said silicon oxide first film layer as they become exposed during said etching of said polysilicon second film layer
    (m) selectively removing the remaining portions of said silicon nitride third layer;
    (n) etching said remaining portions of said silicon oxide first film layer sufficiently to expose the remaining portions of said barrier layer thereunder to remove said silicon oxide; and
    (o) selectively wet etching said silicon nitride barrier layer portions sufficiently with an etchant selective to silicon nitride in preference to silicon to expose corresponding portions of said underlying silicon substrate thereunder;
whereby a structure is provided comprising a pattern formed from said polysilicon second film layer on said underlying silicon substrate without employing dry etching techniques at those steps in the process when damage to the underlying silicon substrate may occur.

2. A process for patterning a plurality of layers over an underlying substrate material without employing dry etching techniques at those steps in the process when damage to the underlying substrate material by dry etching may occur which comprises:
    (a) applying a barrier layer over said underlying substrate material comprising a material capable of being removed by an etchant which will not remove a substantial amount of said underlying substrate material;
    (b) applying a first film layer over said barrier layer comprising a material capable of being removed by an etchant which will not remove a substantial amount of said barrier layer;
    (c) patterning said first film layer and said barrier layer thereunder using one or more selective etchants to provide one or more portions remaining over said underlying substrate material;
    (d) forming a spacer layer over said patterned first film layer;
    (e) anisotropically etching said spacer layer over said patterned first film layer to form spacer members on the sides of said patterned portions of said first film layer which will serve to mask portions of said substrate thereunder;
    (f) forming insulation members over the remainder of said substrate;
    (g) removing said spacer members;
    (h) applying a second film layer over said underlying substrate material and said one or more remaining portions of said first film layer comprising a material capable of being removed by an etchant which will not remove a substantial amount of said first film layer;

(i) applying a third film layer over said second film layer comprising a material capable of being removed by an etchant which will not remove a substantial amount of either said first film layer or said second film layer;

(j) applying a planarizing layer of photoresist material over said third film layer;

(k) planarizing said structure to remove all of said photoresist layer and said third film layer in the region over said one or more remaining portions of said first film layer, thereby exposing said second film layer;

(l) etching exposed portions of said second film layer to exposed the underlying one or more remaining portions of said first film layer;

(m) selectively removing the remaining portions of said third layer with a wet etchant;

(n) wet etching said remaining portions of said first film layer sufficiently to expose the remaining portions of said barrier layer thereunder without damaging said underlying substrate; and (o) wet etching said barrier layer portions sufficiently to expose corresponding portions of said underlying substrate material thereunder without damaging said exposed substrate material;

whereby a structure is provided comprising a pattern formed from said second film layer on said underlying substrate material without employing dry etching techniques at those steps in the process when damage to the underlying substrate material may occur.

3. The process of claim 2 wherein said first film layer comprises silicon oxide and said step of wet etching said remaining portions of said first film layer further comprises wet etching said remaining silicon oxide with an etchant selected from the class consisting of HF and ammonium fluoride to remove said silicon oxide.

4. The process of claim 1 wherein said step of patterning said silicon oxide first film layer and said silicon nitride barrier layer thereunder to provide one or more portions remaining over said underlying substrate material further comprises anisotropically etching said first film layer and said barrier layer whereby said one or more remaining portions comprise pedestal portions with sidewalls perpendicular to said underlying material.

5. The process of claim 4 wherein said step of planarizing said structure to remove said planarizing material layer and said silicon nitride third film layer in the region over said one or more remaining portions of said silicon oxide first film layer, thereby exposing said polysilicon second film layer further comprises mechanically polishing said structure to remove said portions of said planarizing layer and third film layer.

6. The process of claim 4 wherein said step of planarizing said structure to remove said planarizing layer and said silicon nitride third film layer in the region over said one or more remaining portions of said silicon oxide first film layer, thereby exposing said polysilicon second film layer further comprises anisotropically etching said structure to remove said portions of said planarizing layer and third film layer, wherein said second film layer and said remaining portions of said first film protect said underlying material from damage from said dry etching.

7. The process of claim 1 wherein said step of patterning said first film layer of silcion oxide and said silicon nitride barrier layer thereunder to provide one or more portions remaining over said underlying substrate material further comprises patterning said silicon oxide layer with a wet etchant selected from the class consisting of HF and ammonium fluoride to remove unmasked portions of said silicon oxide and then etching the exposed portions of said silicon nitride barrier layer thereunder using a phosphoric acid etchant.

8. The process of claim 1 wherein said step of etching exposed portions of said polysilicon second film layer to exposed the underlying one or more remaining portions of said silicon oxide first film layer further comprises anisotropically etching said polysilicon second film layer.

9. The process of claim 1 wherein said step of etching exposed portions of said polysilicon second film layer to exposed the underlying one or more remaining portions of said silicon oxide first film layer further comprises etching said polysilicon second film layer with KOH to selectively remove portions of said polysilicon second layer without etching the exposed portions of said silicon nitride barrier layer or said pattern portions of said silicon oxide first film layer as they become exposed during said etching of said polysilicon second film layer.

10. The process of claim 1 wherein said step of selectively removing the remaining portions of said silicon nitride third layer further comprises anisotropically etching said third layer to remove said remaining portions.

11. The process of claim 1 wherein said step of selectively removing the remaining portions of said silicon nitride third layer further comprises removing the remaining portions of said silicon nitride third film layer using a phosphoric acid etchant.

12. The process of claim 1 wherein said step of etching said remaining portions of said silicon oxide first film layer sufficiently to expose the remaining portions of said silicon nitride barrier layer thereunder further comprises anisotropically etching said remaining portions of said silicon oxide first film layer.

13. The process of claim 1 wherein said step of etching said remaining portions of said silicon oxide first film layer sufficiently to expose the remaining portions of said silicon nitride barrier layer thereunder further comprises wet etching said remaining portions of said silicon oxide first film layer with an etchant selected from the class consisting of HF and ammonium fluoride to remove said silicon oxide.

14. The process of claim 13 wherein said step of wet etching said silicon nitride barrier layer portions sufficiently to expose corresponding portions of said underlying silicon substrate material thereunder further comprises removing said exposed silicon nitride barrier layer portion.

* * * * *